(12) United States Patent
Hwang et al.

(10) Patent No.: US 9,997,668 B2
(45) Date of Patent: Jun. 12, 2018

(54) SEMICONDUCTOR LIGHT-EMITTING DEVICE

(71) Applicant: SAMSUNG ELECTRONICS CO., LTD., Suwon-si, Gyeonggi-do (KR)

(72) Inventors: Kyung Wook Hwang, Hwaseong-si (KR); Joong Kon Son, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/365,102

(22) Filed: Nov. 30, 2016

(65) Prior Publication Data

US 2017/0084783 A1 Mar. 23, 2017

Related U.S. Application Data

(62) Division of application No. 14/662,149, filed on Mar. 18, 2015, now Pat. No. 9,515,224.

(30) Foreign Application Priority Data

Aug. 25, 2014 (KR) ........................ 10-2014-0110660

(51) Int. Cl.
*H01L 33/10* (2010.01)
*H01L 33/24* (2010.01)
*H01L 33/00* (2010.01)
*H01L 33/12* (2010.01)
*H01L 33/32* (2010.01)

(Continued)

(52) U.S. Cl.
CPC ............ *H01L 33/10* (2013.01); *H01L 33/007* (2013.01); *H01L 33/0025* (2013.01); *H01L 33/12* (2013.01); *H01L 33/24* (2013.01); *H01L 33/32* (2013.01); *H01L 33/42* (2013.01); *H01L 33/46* (2013.01)

(58) Field of Classification Search
CPC .................................. H01L 33/0004–33/648
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| KR | 10-2006-0059783 A | 6/2006 |
| KR | 10-2009-0079122 A | 7/2009 |
| KR | 10-2012-0086196 A | 8/2012 |

*Primary Examiner* — Cuong B Nguyen
(74) *Attorney, Agent, or Firm* — Lee & Morse, P.C.

(57) ABSTRACT

A semiconductor light-emitting device includes a substrate, a first reflective layer disposed on the substrate and including first openings, a first conductivity-type semiconductor layer grown in and extending from the first openings and connected on the first reflective layer, a second reflective layer disposed on the first conductivity-type semiconductor layer and including second openings having lower surfaces disposed to be spaced apart from upper surfaces of the first openings, and a plurality of light-emitting nanostructures including nanocores extending from the second openings and formed of a first conductivity-type semiconductor material, and active layers and second conductivity-type semiconductor layers sequentially disposed on the nanocores.

1 Claim, 18 Drawing Sheets

(51) Int. Cl.
  *H01L 33/42*   (2010.01)
  *H01L 33/46*   (2010.01)

(56) References Cited

U.S. PATENT DOCUMENTS

| | | | |
|---|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,489,068 B2 | 2/2009 | Hsieh et al. |
| 7,501,656 B2 | 3/2009 | Han et al. |
| 7,709,857 B2 | 5/2010 | Kim et al. |
| 7,719,013 B2 | 5/2010 | Lee |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Cho et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,274,093 B2 | 9/2012 | Park et al. |
| 8,324,646 B2 | 12/2012 | Lee et al. |
| 8,390,006 B2 | 3/2013 | Kang et al. |
| 8,399,906 B2 | 3/2013 | Tsai et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,624,482 B2 | 1/2014 | Lin |
| 8,735,931 B2 | 5/2014 | Han et al. |
| 8,766,295 B2 | 7/2014 | Kim |
| 2004/0113166 A1 | 6/2004 | Tadamoto et al. |
| 2006/0118803 A1 | 6/2006 | Lee et al. |
| 2009/0114935 A1* | 5/2009 | Huang .............. H01L 33/10 257/98 |
| 2010/0123118 A1 | 5/2010 | Hu et al. |
| 2011/0212559 A1* | 9/2011 | Ohmae .............. C30B 23/04 438/46 |
| 2011/0303934 A1 | 12/2011 | Kang et al. |
| 2015/0144873 A1 | 5/2015 | Hwang et al. |

\* cited by examiner

SEMICONDUCTOR LIGHT-EMITTING DEVICE

CROSS-REFERENCE TO RELATED APPLICATIONS

This is a divisional application based on pending application Ser. No. 14/662,149, filed Mar. 18, 2015, the entire contents of which is hereby incorporated by reference.

This application claims priority under 35 U.S.C. § 119 to Korean Patent Application No. 10-2014-0110660 filed on Aug. 25, 2014, with the Korean Intellectual Property Office, the disclosure of which is incorporated herein by reference.

BACKGROUND

The present disclosure relates to a semiconductor light-emitting device.

A semiconductor light-emitting device emits light through the combination of electrons and holes injected in a compound semiconductor active layer. However, when dislocations exist in such a semiconductor light-emitting device, electrons and holes may combine in the dislocations, thermal energy rather than light energy may be mainly converted from electric energy, and thus light extraction efficiency of the semiconductor light-emitting device may be reduced. Accordingly, various technologies for reducing dislocations and improving light extraction efficiency may be required.

SUMMARY

An aspect of the present disclosure may provide a semiconductor light-emitting device having improved light extraction efficiency.

According to an aspect of the present disclosure, a semiconductor light-emitting device includes a substrate, a first reflective layer disposed on the substrate and including first openings, a first conductivity-type semiconductor layer grown in and extending from the first openings and connected on the first reflective layer, a second reflective layer disposed on the first conductivity-type semiconductor layer and including second openings having lower surfaces disposed to be spaced apart from upper surfaces of the first openings, and a plurality of light-emitting nanostructures including nanocores extending from the second openings and formed of a first conductivity-type semiconductor material, and active layers and second conductivity-type semiconductor layers sequentially disposed on the nanocores.

In some exemplary embodiments, the first reflective layer may include a pillar-shaped distributed Bragg reflector extending perpendicular to the substrate, and the distributed Bragg reflector may be surrounded by the first openings, and the distributed Bragg reflector is surrounded by the first openings.

In other exemplary embodiments, the first openings may have a pillar shape extending perpendicular to the substrate, and the first reflective layer may include a distributed Bragg reflector surrounding the first openings.

Here, areas of the upper surfaces of the first openings may be greater than areas of the lower surfaces of the second openings.

In other exemplary embodiments, the first openings may have a pillar shape having a lateral surface angled with respect to an upper surface of the substrate, and the first reflective layer may include a distributed Bragg reflector surrounding the first openings.

In other exemplary embodiments, the second reflective layer may include a distributed Bragg reflector surrounding the second openings.

In other exemplary embodiments, the semiconductor light-emitting device may further include a third reflective layer disposed below the first reflective layer, wherein the third reflective layer includes third openings having upper surfaces disposed to be spaced apart from lower surfaces of the first openings, and a first conductivity-type semiconductor bottom layer grown in and extending from the third openings and connected on the third reflective layer.

In other exemplary embodiments, the semiconductor light-emitting device may further include a buffer layer disposed on the substrate.

In other exemplary embodiments, the semiconductor light-emitting device may further include a first electrode disposed on the first conductivity-type semiconductor layer.

In other exemplary embodiments, the semiconductor light-emitting device may further include a contact electrode layer disposed on the plurality of light-emitting nanostructures and the second reflective layer.

In other exemplary embodiments, a thickness of a portion of the first conductivity-type semiconductor layer formed on the first reflective layer may be less than that of the first reflective layer.

In other exemplary embodiments, the substrate may be silicon (Si) substrate.

According to another aspect of the present disclosure, a semiconductor light-emitting device includes a substrate, a first reflective layer disposed on the substrate, wherein the second reflective layer includes first openings, a first conductivity-type semiconductor lower layer grown in and extending from the first openings and connected on the first reflective layer, a second reflective layer disposed on the first conductivity-type semiconductor lower layer, wherein the second reflective layer includes second openings having lower surfaces disposed to be spaced apart from upper surfaces of the first openings, a first conductivity-type semiconductor upper layer grown in and extending from the second openings and connected on the second reflective layer, and an active layer and a second conductivity-type semiconductor layer sequentially disposed on the first conductivity-type semiconductor upper layer.

In other exemplary embodiments, the second reflective layer includes a pillar-shaped distributed Bragg reflector having a lateral surface angled with respect to an upper surface of the substrate, and the distributed Bragg reflector is surrounded by the second openings.

In other exemplary embodiments, the second openings have pillar shape having a lateral surface angled with respect to the upper surface of the substrate, and the second reflective layer includes a distributed Bragg reflector surrounding the second openings.

In other exemplary embodiments, the first reflective layer may include trench-shaped first openings extending in one direction and bar-shaped distributed Bragg reflectors disposed alternately with the first openings, and the second reflective layer may include trench-shaped second openings extending in one direction and bar-shaped distributed Bragg reflectors disposed alternately with the second openings.

According to another aspect of the present disclosure, a semiconductor light-emitting device may include a substrate, a second reflective layer including a second pattern and a second opening penetrating through the second reflective layer, a light-emitting structure including a first layer formed of a first conductivity-type semiconductor material, a second conductivity-type semiconductor layer, and an active layer interposed between the first layer and the second conductivity-type semiconductor layer, a first reflective layer interposed between the light-emitting structure and the substrate and including a first pattern and a first opening penetrating through the first reflective layer, and a first conductivity-type semiconductor layer including a first portion filling the first opening and a second portion interposed between the first pattern and the second opening. A portion of the first layer may fill the second opening.

In other exemplary embodiments, the first and second openings may not overlap with each other.

In other exemplary embodiments, the substrate may be silicon (Si) substrate.

In other exemplary embodiments, the first reflective layer may include a distributed Bragg reflector.

In other exemplary embodiments, the second reflective layer may include a distributed Bragg reflector.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
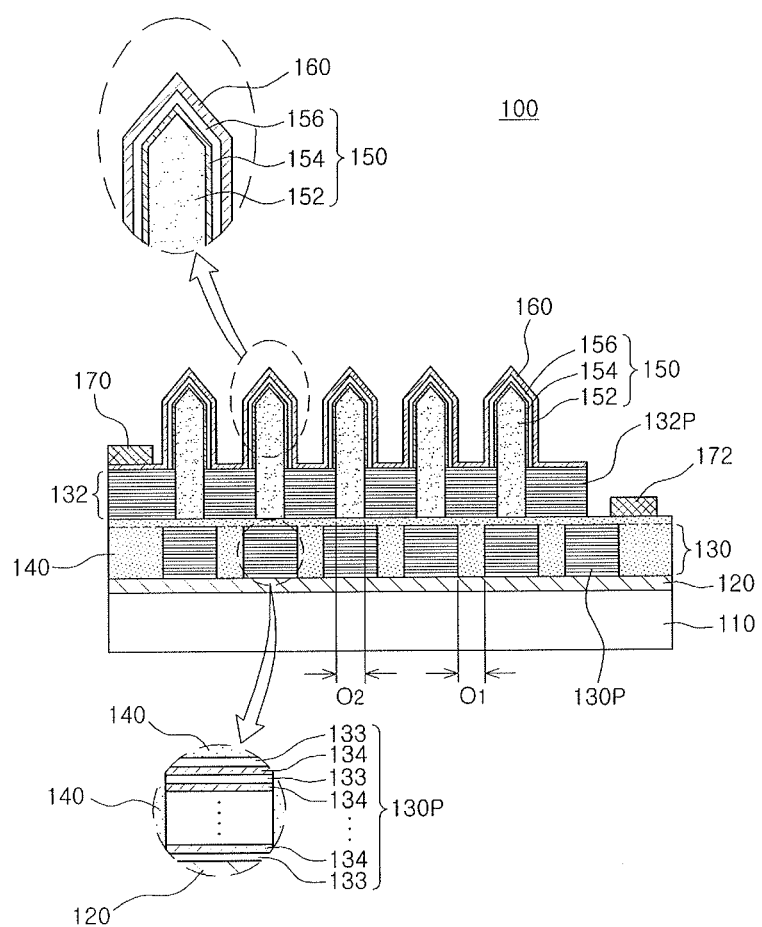
FIG. 1 is a cross-sectional view of a semiconductor light-emitting device according to an exemplary embodiment of the present disclosure.

Hereinafter, embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Reference throughout this disclosure to "one exemplary embodiment" or "an exemplary embodiment" is provided to emphasize a particular feature, structure, or characteristic, and do not necessarily refer to the same embodiment. Furthermore, the particular features, structures, or characteristics may be combined in any suitable manner in one or more embodiments. For example, a context described in a specific exemplary embodiment may be used in other embodiments, even if it is not described in the other embodiments, unless it is described contrary to or inconsistent with the context in the other embodiments.

Unless described otherwise, throughout this disclosure, terms such as "on," "upper surface," "below," "lower surface," "upward," "downward," "side surface," "high," and "low" may be relative terms based on the drawings, and may vary, depending on a direction in which a light-emitting device is disposed. Further, it will be understood that when a layer is referred to as being "on" or "below" another layer or a substrate, the layer may be formed directly on the other layer or the substrate, or an intervening layer may exist between the layer and the other layer or the substrate.

FIG. 1 is a cross-sectional view illustrating a semiconductor light-emitting device according to an exemplary embodiment of the present disclosure.

Referring to FIG. 1, a semiconductor light-emitting device 100 may include a substrate 110, a buffer layer 120 disposed on the substrate 110, a first reflective layer 130 disposed on the buffer layer 120 and including first openings O1, a first conductivity-type semiconductor layer 140 grown in and extending from the first openings O1 and connected on the first reflective layer 130, a second reflective layer 132 disposed on the first conductivity-type semiconductor layer 140 and including second openings O2 having lower surfaces disposed to be spaced apart from upper surfaces of the first openings O1, a plurality of light-emitting nanostructures 150 including nanocores 152 grown in and extending from the second openings O2 and formed of a first conductivity-type semiconductor material, and active layers 154 and second conductivity-type semiconductor layers 156 sequentially disposed on the nanocores 152, a contact electrode layer 160 disposed on the second reflective layer 132 and the plurality of light-emitting nanostructures 150, a second electrode 170 disposed on a portion of the contact electrode layer 160, and a first electrode 172 disposed on an exposed portion of an upper surface of the first conductivity-type semiconductor layer 140. The exposed portion of the upper surface of the first conductivity-type semiconductor layer 140 may be formed by removing one side of the semiconductor light-emitting device 100.

The substrate 110 may be provided as a growth substrate for a semiconductor layer. The substrate 110 may be formed of an insulating, conductive, or semiconductor material. Meanwhile, as a material for the growth substrate, silicon (Si) may be used. Since a Si substrate is appropriate for obtaining a large diameter and has relatively low manufacturing costs, mass productivity of semiconductor light-emitting devices may be improved. In addition, since the Si substrate has conductivity, an electrode may be formed on a lower surface of the Si substrate. Further, since the Si substrate has a higher thermal conductivity than a sapphire substrate, warpage thereof may not be increased at high temperature.

The buffer layer 120 disposed on the substrate 110 may function to reduce dislocations generated while a semiconductor layer is grown on the substrate 110, and prevent light generated by a light-emitting layer from being absorbed by the substrate 110. When the Si substrate is used, the buffer layer 120 may be formed of a material having small differences in thermal expansion coefficient and lattice constant from the Si substrate. For example, the buffer layer 120 may be one selected from a group consisting of AlN, AlGaN, InGaN, and GaN.

The first reflective layer 130 including the first openings O1 may be disposed on the buffer layer 120. The first openings O1 may refer to empty spaces between patterns 130P in the patterned first reflective layer 130, prior to forming other layers, such as the first conductivity-type semiconductor layer 140. The first openings O1 may be formed to have a size in the range of several to several tens of micrometers, for example, a diameter in the range of about 1 μm to about 10 μm.

The patterns 130P of the first reflective layer 130 may be a distributed Bragg reflector. In addition, the patterns 130P of the first reflective layer 130 may be an omni-directional reflector (ODR).

The distributed Bragg reflector is a multilayer structured reflector in which materials having different refractive indices are periodically layered. For example, the distributed Bragg reflector may have a structure in which first and second dielectric layers 133 and 134 having different refractive indices are alternately deposited. Each of the first and second dielectric layers 133 and 134 may be an oxide or nitride of an element selected from the group consisting of Si, Zr, Ta, Ti, and Al. More specifically, each of the first and second dielectric layers 133 and 134 may be formed of at least one material among $SiO_2$, $Si_3N_4$, SiON, $TiO_2$, $Al_2O_3$, and ZrO. A refractive index of $SiO_2$ is 1.46, a refractive index of $Si_3N_4$ is 2.05, a refractive index of SiON is 1.46~2.05, a refractive index of $TiO_2$ is 2.49~2.90, a refractive index of $Al_2O_3$ is 1.77, and a refractive index of ZrO is 1.90.

When a wavelength of light generated by a light-emitting layer is λ, and n1 and n2 are refractive indices of the first and second dielectric layers 133 and 134, respectively, thicknesses d1 and d2 of the first and second dielectric layers 133 and 134 may be represented by the following Equation 1, $$d1 = \frac{(2p-1) \times \lambda}{4 \times n1}$$
$$d2 = \frac{(2q-1) \times \lambda}{4 \times n2}$$
[Equation 1]

wherein p and q are integers of 1 or more.

More specifically, the thicknesses of the first and second dielectric layers 133 and 134 may be in the range of about 300 Å to about 900 Å.

The distributed Bragg reflector including the first and second dielectric layers 133 and 134 having such thicknesses and reflective indices may show high reflectivity of 95% or more.

A first conductivity-type semiconductor material may be grown in and extend from the first openings O1 disposed between the patterns 130P of the first reflective layer 130 and extend onto the first reflective layer 130 to be connected on the first reflective layer 130. That is, the first conductivity-type semiconductor material may be subjected to epitaxial lateral overgrowth (ELO) using the distributed Bragg reflector, that is, the patterns 130P, as a mask to form the first conductivity-type semiconductor layer 140. In FIG. 1, the first conductivity-type semiconductor material grown from the first openings O1, and the first conductivity-type semiconductor material connected on the first reflective layer 130 are divided and marked by a dotted line in the first conductivity-type semiconductor layer 140.

The reason for forming the first conductivity-type semiconductor layer 140 by the ELO method using the distributed Bragg reflector including the first openings O1 is that when the first conductivity-type semiconductor material is a group-III nitride-based semiconductor material, it is difficult to grow a crystalline thin-film of the group-III nitride-based semiconductor material on the distributed Bragg reflector.

The first conductivity-type semiconductor material forming the first conductivity-type semiconductor layer 140 may be, for example, a nitride-based semiconductor material satisfying $Al_xIn_yGa_{1-x-y}N$ (0≤x≤1, 0≤y≤1, and 0≤x+y≤1) doped with n-type impurities.

The second reflective layer 132 including the second openings O2 having the lower surfaces disposed to be spaced apart from the upper surfaces of the first openings O1 may be formed on the first conductivity-type semiconductor layer 140. The second openings O2 may refer to empty spaces between patterns 132P of the patterned second reflective layer 132, prior to forming other layers, such as the nanocores 152. The second openings O2 may be formed to have a size in the range of several to several tens of micrometers, for example, a diameter in the range of about 1 μm to about 10 μm.

The patterns 132P of the second reflective layer 132 may be a distributed Bragg reflector. In addition, the patterns 132P of the second reflective layer 132 may be an omni-directional reflector (ODR). The patterns 132P of the second reflective layer 132 may have the same structure and the same material as the patterns 130P of the first reflective layer 130.

A first conductivity-type semiconductor material may be grown in and extend from the second openings O2 to be nanocores 152. The first conductivity-type semiconductor material forming the nanocores 152 may be the same as the material forming the first conductivity-type semiconductor layer 140.

Depending on the size of the second openings O2, diameters, lengths, positions, and growth conditions of the nanocores 152 may be determined. The second openings O2 may have a variety of shapes, such as a circle, a rectangle, or a hexagon.

The active layers 154 and the second conductivity-type semiconductor layers 156 may be sequentially grown on surfaces of the nanocores 152 to form light-emitting nanostructures 150 having core-shell structures. Each light-emitting nanostructure 150 may include a pillar-shaped body and an upper end portion disposed on the body. Side surfaces of the body of the light-emitting nanostructures 150 may have the same crystal plane, and the upper end portions of the light-emitting nanostructures 150 may have a different crystal plane from the side surfaces of the light-emitting nanostructures 150. For example, when a growth surface of the first conductivity-type semiconductor layer 140 exposed by the second openings O2 is a c-plane, the side surfaces of the body portions of the light-emitting nanostructures 150 may be a nonpolar plane (m), and surfaces of the upper end portions of the light-emitting nanostructures 150 may be a semipolar plane (r).

The active layers 154 disposed on the surface of the nanocores 152 may have a multiple quantum well (MQW) structure in which quantum well layers and quantum barrier layers are alternately stacked, or a single quantum well (SQW) structure. For example, the active layers 154 may be formed of a GaN-based group III-V nitride semiconductor material. More specifically, the active layers 154 may have a MQW or SQW structure formed of InGaN/GaN, InGaN/InGaN, InGaN/AlGaN, or InGaN/InAlGaN.

A second conductivity-type semiconductor material forming the second conductivity-type semiconductor layers 156 disposed on the active layers 154 may be, for example, a nitride semiconductor material doped with p-type impurities and satisfying $Al_xIn_yGa_{1-x-y}N$ ($0 \leq x \leq 1$, $0 \leq y \leq 1$, and $0 \leq x+y \leq 1$).

The contact electrode layer 160 may be disposed on the second conductivity-type semiconductor layers 156 and the patterns 132P of the second reflective layer 132. The contact electrode layer 160 may be one of a transparent conductive oxide layer or a nitride layer so that light emitted by the light-emitting nanostructures 150 passes through the contact electrode layer 160. The transparent conductive contact electrode layer 160 may be, for example, at least one selected from the group consisting of, indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). As necessary, the contact electrode layer 160 may include graphene.

The first and second electrodes 172 and 170 may be formed to apply power so that electrons and holes are combined in the active layers 154. The second electrode layer 170 may be disposed on a portion of the contact electrode layer 160. One side of the second reflective layer 132 may be removed to expose a portion of the first conductivity-type semiconductor layer 140, and then the first electrode layer 172 may be disposed on the exposed portion of the first conductivity-type semiconductor layer 140.

Although two reflective layers are stacked in the embodiment of FIG. 1, three or more reflective layers may be stacked in other embodiments (not shown) of the present disclosure, as necessary. For example, when the three reflective layers are stacked, a third reflective layer including third openings may be disposed below the first reflective layer 130 in the embodiment of FIG. 1, and upper surfaces of the third openings may be disposed to be spaced apart from lower surfaces of the first openings O1 of the first reflective layer 130 of FIG. 1. In addition, a bottom layer formed of a first conductivity-type semiconductor material grown in and extending from the third openings and connected on the third reflective layer may be further included.

FIGS. 2 to 11 are process views illustrating each process of a method of fabricating the semiconductor light-emitting device 100 illustrated in FIG. 1.

Figure 2:
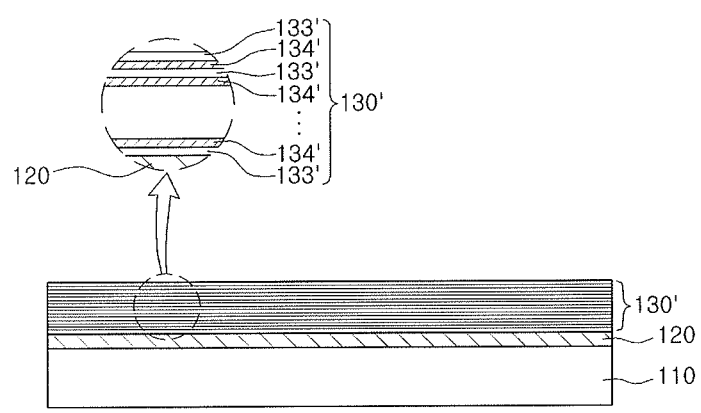
FIGS. 2 to 11 are process views illustrating a method of fabricating the semiconductor light-emitting device according to an exemplary embodiment of the present disclosure.

Referring to FIG. 2, a buffer layer 120 may be formed on a substrate 110, and a first planar reflective layer 130' may be formed on the buffer layer 120. The first planar reflective layer 130' may be, for example, a distributed Bragg reflector in which first and second planar dielectric thin-films 133' and 134' having different refractive indices are alternately stacked and openings are not yet formed therein. A method of growing the buffer layer 120 and the first planar reflective layer 130' may be, for example, metal organic chemical vapor deposition (MOCVD), hydride vapor phase epitaxy (HVPE), or molecular beam epitaxy (MBE).

Figure 3A:
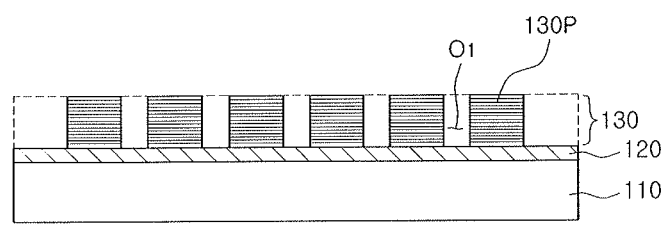

Next, referring to FIG. 3A, portions of the first planar reflective layer 130' in FIG. 2 may be removed to form first openings O1 exposing the buffer layer 120. The first openings O1 may be formed by, for example, a dry etching process. More specifically, the first openings O1 may be formed by performing plasma etching using a combination of $CF_4$, $C_2F_6$, $C_3F_8$, $C_4F_8$, or $CHF_3$ with at least one of $O_2$ and Ar. Through the formation of the first openings O1, patterns 130P of the patterned first reflective layer 130 may be formed.

Figure 3B:
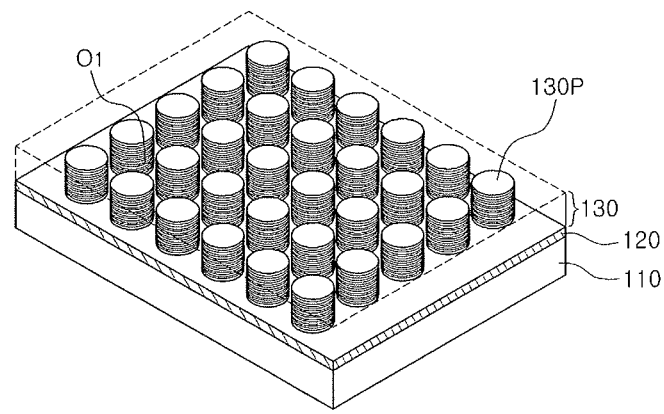

FIG. 3B is a perspective view illustrating a process described with reference to FIG. 3A.

Referring to FIG. 3B, a buffer layer 120 may be formed on the substrate 110, and a first reflective layer 130 may be formed on the buffer layer 120. Here, the patterns 130P of the patterned first reflective layer 130 may be a pillar-shaped distributed Bragg reflector extending perpendicular to the substrate 110. In addition, the patterns 130P may have a polygonal columnar shape having various cross-sectional shapes. The first openings O1 surrounding the patterns 130P may be formed between the patterns 130P.

Figure 3C:
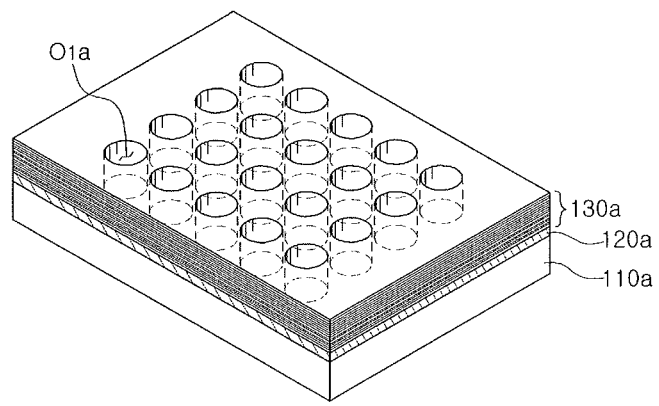

FIG. 3C is a perspective view illustrating a process described with reference to FIG. 3A according to another embodiment of the present invention.

Referring to FIG. 3C, a buffer layer 120a may be formed on a substrate 110a, and a first reflective layer 130a may be formed on the buffer layer 120a. Here, the first reflective layer 130a may include pillar-shaped first openings O1a extending perpendicular to the substrate 110a. In addition, the first openings O1a may have a polygonal columnar shape having various cross-sectional shapes. The first reflective layer 130a may be a distributed Bragg reflector.

Figure 3D:
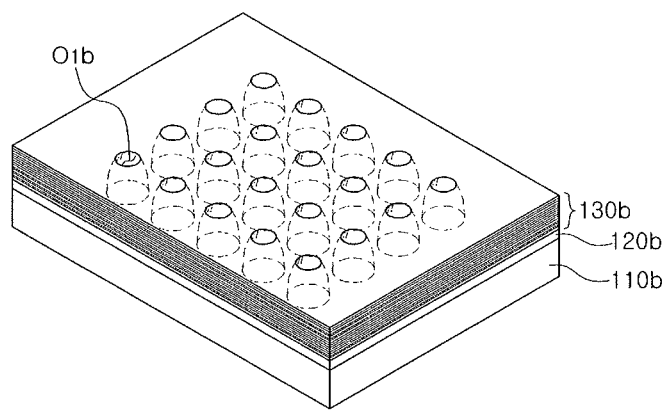

FIG. 3D is a perspective view illustrating a process described with reference to FIG. 3A according to another embodiment of the present invention.

Referring to FIG. 3D, a buffer layer 120b may be formed on a substrate 110b, and a first reflective layer 130b may be formed on the buffer layer 120b. Here, the first reflective layer 130b may include dome-shaped first openings O1b whose upper surfaces are planar.

Figure 4:
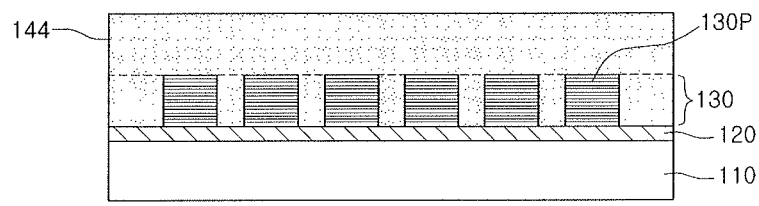

Next to FIG. 3A, referring to FIG. 4, after the substrate 110, the buffer layer 120, and the first reflective layer 130 are formed, a first conductivity-type semiconductor material may be grown in and extend between the patterns 130P of the first reflective layer 130 to be connected on the first reflective layer 130, to form a first conductivity-type semiconductor material layer 144.

Figure 5:
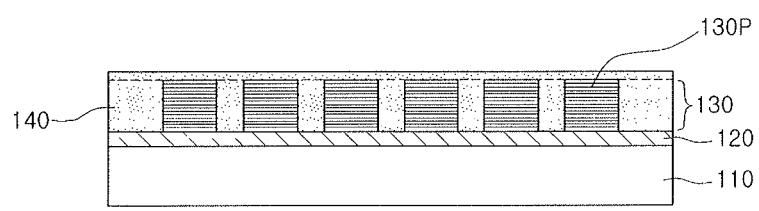

Next, referring to FIG. 5, an upper surface of the first conductivity-type semiconductor material layer 144 grown between the patterns 130P of the first reflective layer 130 disposed on the substrate 110 and the buffer layer 120 and connected on the first reflective layer 130 in FIG. 4 may be polished to form a first conductivity-type semiconductor layer 140 having a planar upper surface. The polishing may be performed using chemical mechanical polishing (CMP), for example. The upper portions of the first conductivity-type semiconductor layer 140, connected on the first reflective layer 130, may be formed to be thin since light emitted from a light-emitting layer is totally reflected on the portions and leaked through side surfaces of the portions when the portion is thick. More specifically, a thickness of the portions, connected on the first reflective layer 130, of the first conductivity-type semiconductor layer 140 may be less than that of the first reflective layer 130.

Figure 6:
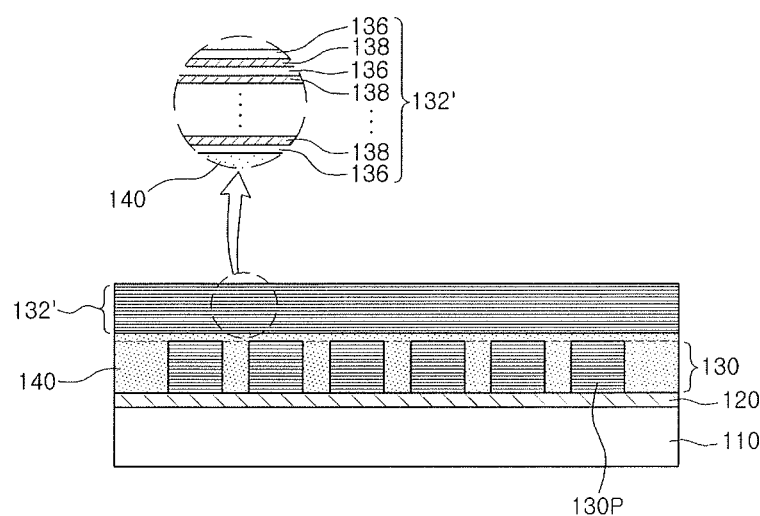

Next, referring to FIG. 6, a second planar reflective layer 132' may be formed on the substrate 110, the buffer layer 120, the first reflective layer 130 including the patterns 130P, and the first conductivity-type semiconductor layer 140. The second planar reflective layer 132' may be, for example, a distributed Bragg reflector in which first and second planar dielectric thin-films 136 and 138 having different refractive indices are alternately stacked, and openings are not formed thereon yet. A method of growing the second planar reflective layer 132' may be the same as the method of growing the first planar reflective layer 130'.

Figure 7:
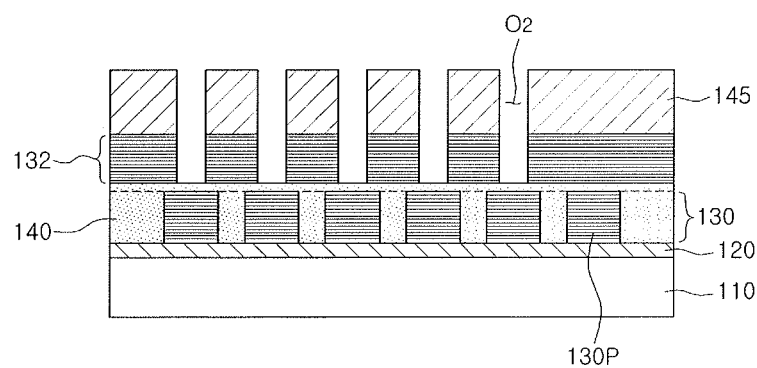

Next, referring to FIG. 7, a mask layer 145 may be formed on the substrate 110, the buffer layer 120, the first reflective layer 130 including the patterns 130P, the first conductivity-type semiconductor layer 140, and the second planar reflective layer 132' of FIG. 6. Then, the mask layer 145 and the second planar reflective layer 132' may be etched to expose the first conductivity-type semiconductor layer 140 and form second openings O2.

Here, upper surfaces of the first openings O1 in FIG. 3A and lower surfaces of the second openings O2 may be disposed to be spaced apart from each other and not to overlap each other. That is, the upper surfaces of the openings O1 in FIG. 3A may be covered with patterns (132P of FIG. 1) of the second reflective layer 132. The reason and advantage that the upper surfaces of the first openings O1 in FIG. 3A do not overlap the lower surfaces of the second openings O2 may be described as follows.

When a semiconductor layer to be grown is a group III nitride-based semiconductor, the semiconductor layer may be grown by the ELO method using a distributed Bragg reflector as a reflective layer. Here, in the case that a single reflective layer is used, a substrate or a buffer layer disposed on the substrate may be exposed by openings and dislocations may be propagated in a light-emitting layer through the openings. In addition, in the case that the substrate is not a light-transmissive substrate such as sapphire but a light-absorbing substrate, light emitted from the light-emitting layer through the openings may be absorbed to the light-absorbing substrate and thus light extraction efficiency may be reduced.

Accordingly, when the second openings O2 are formed on the first reflective layer 130 including the first openings O1 of FIG. 1 such that the lower surfaces of the second openings O2 are spaced apart from the upper surfaces of the first openings O1 of FIG. 1 in order for the upper surfaces of the first openings O1 of FIG. 1 to be masked by the patterns (132P of FIG. 1) of the second reflective layer 132, the dislocations propagated through the first openings O1 of FIG. 1 may be blocked by the patterns (132P of FIG. 1) of the second reflective layer 132. In addition, since light emitted from the light-emitting layer is reflected by the patterns 130P of the first reflective layer 130 on the lower surfaces of the second openings O2, the light may not be absorbed by the substrate 110. Thus, a semiconductor light-emitting device having reduced dislocations and high light extraction efficiency may be formed.

Here, areas of the upper surfaces of the first openings O1 in FIG. 3A may be greater than areas of the upper surfaces of the second openings O2. When the areas of the upper surfaces of the first openings O1 in FIG. 3A are large, a growth rate of the first conductivity-type semiconductor layer 140 by the ELO may be increased.

Figure 8:
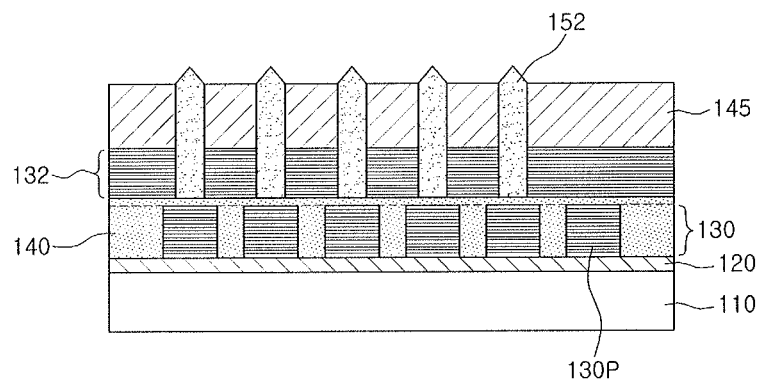

Next, referring to FIG. 8, after forming the second reflective layer 132 and the mask layer 145 on the substrate 110, the buffer layer 120, the first reflective layer 130 including the patterns 130P, and the first conductivity-type semiconductor layer 140, nanocores 152 formed of a first conductivity-type semiconductor material and extending from the second openings O2 of FIG. 7 and may be formed. The first conductivity-type semiconductor material may be the same as the first conductivity-type semiconductor layer 140 in FIG. 1.

The nanocores 152 may have a variety of shapes. For example, the nanocores 152 may have a pillar shape whose width decreases toward a lower portion thereof or a pillar shape whose width increases toward a lower portion thereof.

Figure 9:
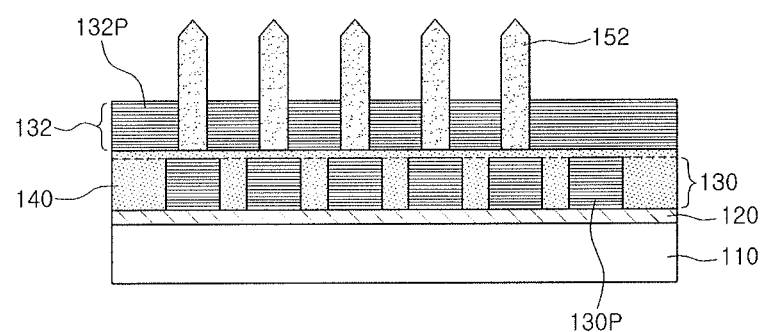

Next, referring to FIG. 9, after the mask layer 145 and the nanocores 152 illustrated in FIG. 8 are formed on the substrate 110, the buffer layer 120, the first reflective layer 130 including the patterns 130P, and the second reflective layer 132, the mask layer 145 illustrated in FIG. 8 may be removed. By removing the mask layer 145 illustrated in FIG. 8, patterns 132P of the second reflective layer 132 may be exposed.

In some embodiments, after the mask layer 145 illustrated in FIG. 8 is removed, a heat treatment process may be further carried out to change crystal planes of the nanocores 152 into stable planes advantageous for crystal growth, such as a semipolar crystal plane or a nonpolar crystal plane.

Figure 10:
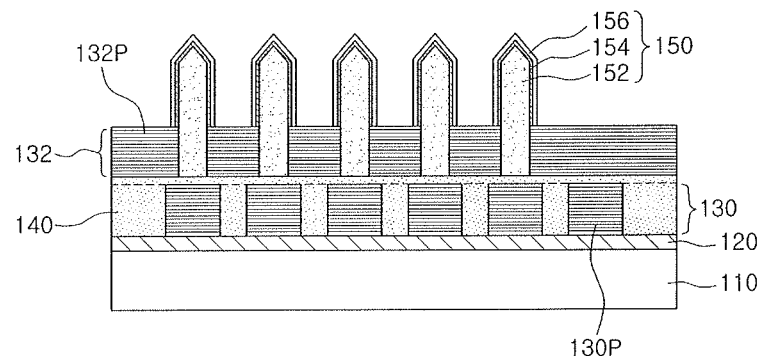

Next, referring to FIG. 10, after forming the substrate 110, the buffer layer 120, the first reflective layer 130 including the patterns 130P, the second reflective layer 132 including the patterns 132P, and the nanocores 152, active layers 154 and second conductivity-type semiconductor layers 156 may be sequentially formed on surfaces of the plurality of nanocores 152. Thus, the light-emitting nanostructures 150 may have a core-shell structure configured with the nanocores 152, the active layers 154, and the second conductivity-type semiconductor layers 156.

Figure 11:
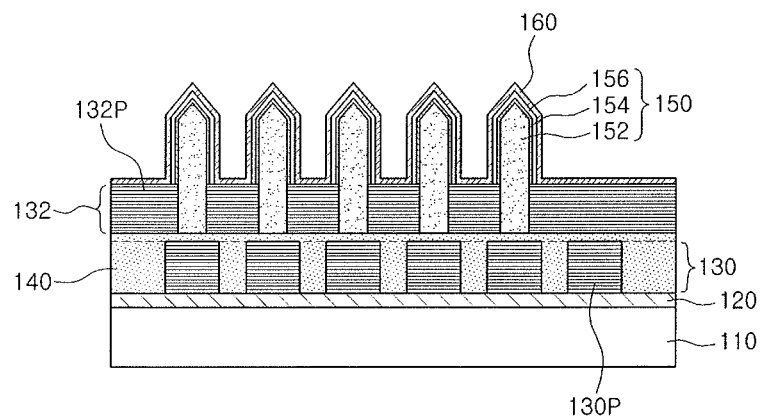

Next, referring to FIG. 11, after forming the substrate 110, the buffer layer 120, the first reflective layer 130 including the patterns 130P, the second reflective layer 132 including the patterns 132P, the nanocores 152, the active layers 154, and the second conductivity-type semiconductor layers 156, a contact electrode layer 160 may be formed on the second conductivity-type semiconductor layers 156 and the patterns 132P of the second reflective layer 132. The contact electrode layer 160 may be formed by, for example, chemical vapor deposition (CVD) or physical vapor deposition (PVD).

Figure 12:
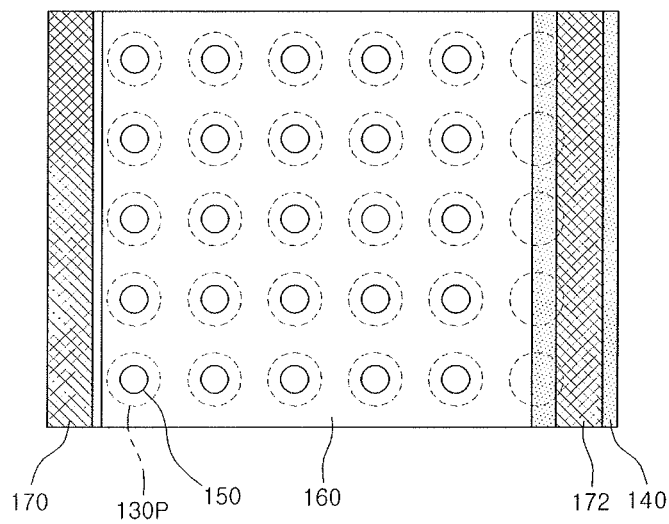
FIG. 12 is a plan view of a semiconductor light-emitting device according to an exemplary embodiment of the present disclosure.

FIG. 12 is a plan view illustrating the semiconductor light-emitting device 100 illustrated in FIG. 1.

Referring to FIG. 12, light-emitting nanostructures 150 may be disposed on the patterns 130P of the first reflective layer 130 of FIG. 1. The patterns 130P of the first reflective layer 130 of FIG. 1 and the light-emitting nanostructures 150 may have a cylindrical shape. That is, the first reflective layer of FIG. 12 may be the same as the first reflective layer 130 illustrated in FIG. 3B.

A contact electrode layer 160 may be formed on the light-emitting nanostructures 150 and the second reflective layer 132 of FIG. 1. A second electrode 170 may be disposed on a portion of the contact electrode layer 160 where the light-emitting nanostructures 150 are not formed. One side of the semiconductor light-emitting device 100 of FIG. 1 may be removed to expose a portion of the upper surface of the first conductivity-type semiconductor layer 140 of FIG. 1, and a first electrode 172 may be disposed on the exposed portion of the upper surface of the first conductivity-type semiconductor layer 140 of FIG. 1.

Figure 13:
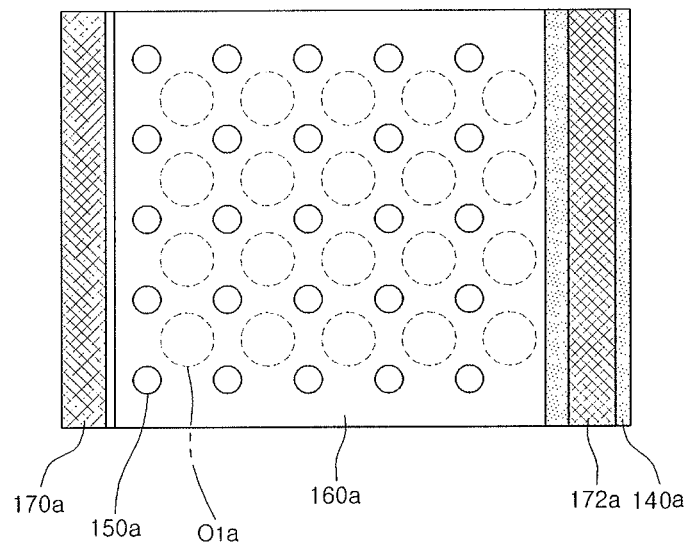
FIG. 13 is a plan view of a semiconductor light-emitting device according to an exemplary embodiment of the present disclosure.

FIG. 13 is a plan view illustrating a semiconductor light-emitting device according to an exemplary embodiment of the present disclosure.

Referring to FIG. 13, a first reflective layer may be the same as the first reflective layer 130a of FIG. 3C. The first reflective layer 130a of FIG. 3C may include the pillar-shaped first openings O1a extending perpendicular to a substrate. Upper surfaces of the first openings O1a may be disposed to be spaced apart from lower surfaces of light-emitting nanostructures 150a.

A contact electrode layer 160a may be formed on the light-emitting nanostructures 150a and the second reflective layer. A second electrode 170a may be formed on a portion of the contact electrode layer 160a where the light-emitting nanostructures 150a are not formed. One side of the semiconductor light-emitting device 100 of FIG. 1 may be removed to expose a portion of the upper surface of the first conductivity-type semiconductor layer 140 of FIG. 1, and a first electrode 172a may be disposed on the exposed portion of the upper surface of the first conductivity-type semiconductor layer 140 of FIG. 1.

Figure 14:
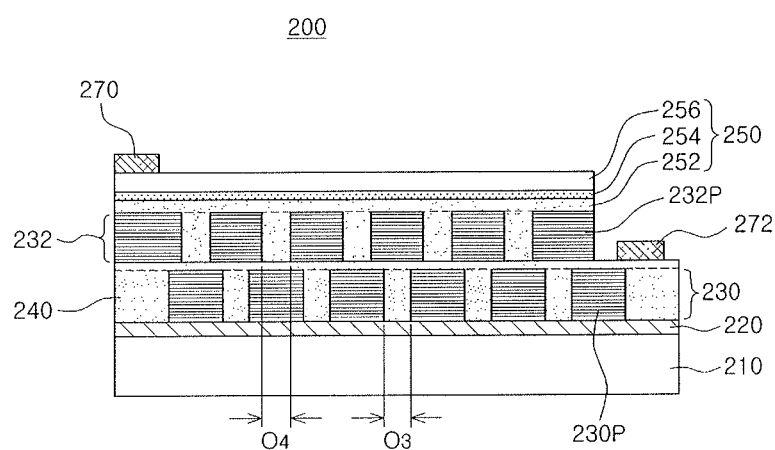
FIG. 14 is a cross-sectional view of a semiconductor light-emitting device according to an exemplary embodiment of the present disclosure.

FIG. 14 is a schematic cross-sectional view illustrating a semiconductor light-emitting device according to an exemplary embodiment of the present disclosure. Hereinafter, duplicated descriptions of FIG. 1 will be omitted.

Referring to FIG. 14, a semiconductor light-emitting device 200 may include a substrate 210, a buffer layer 220 disposed on the substrate 210, a first reflective layer 230 disposed on buffer layer 220 and including first openings O3 and patterns 230P, a first conductivity-type semiconductor lower layer 240 grown in and extending from the first openings O3 and connected on the first reflective layer 230, a second reflective layer 232 disposed on the first conductivity-type semiconductor lower layer 240 and including patterns 232P and second openings O4 having lower surfaces disposed to be spaced apart from upper surfaces of the first openings O3, a light-emitting structure 250 including a first conductivity-type semiconductor upper layer 252 grown in and extending from the second openings O4 and connected on the second reflective layer 232, an active layer 254 and a second conductivity-type semiconductor layer 256 sequentially stacked on the first conductivity-type semiconductor upper layer 252, a second electrode 270 disposed on the second conductivity-type semiconductor layers 256, and a first electrode 272 disposed on an exposed portion of an upper surface of the first conductivity-type semiconductor lower layer 240. The exposed portion of the upper surface of the first conductivity-type semiconductor lower layer 240 may be formed by removing one side of the semiconductor light-emitting device 200.

Figure 15A:
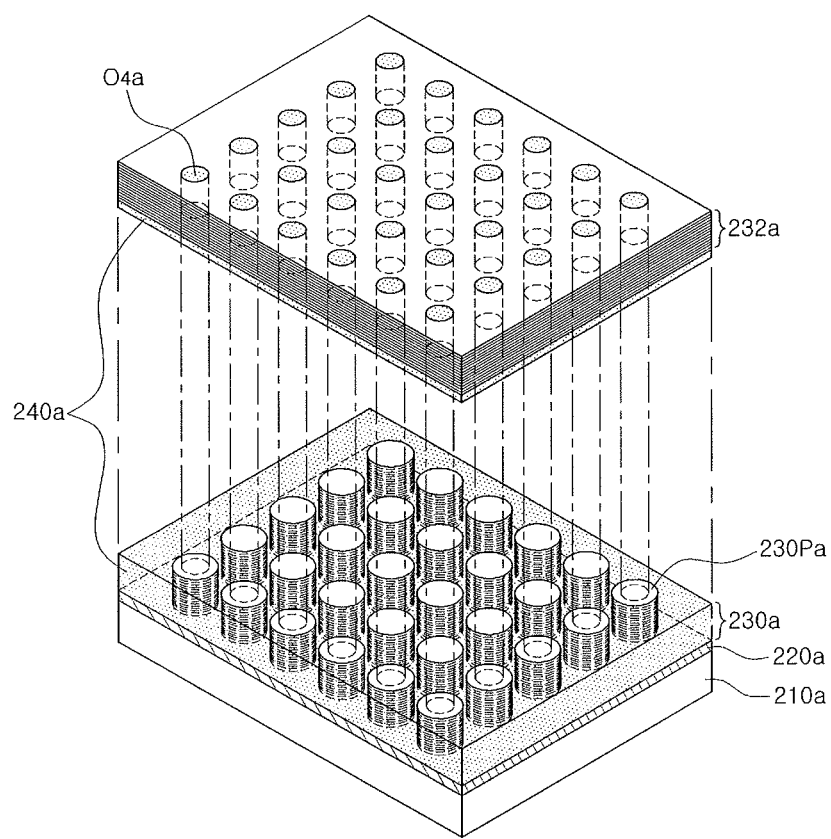
FIG. 15A is an exploded perspective view illustrating a first reflective layer and a second reflective layer of a semiconductor light-emitting device according to an exemplary embodiment of the present disclosure.

FIG. 15A is an exploded perspective view illustrating only a substrate 210a, a buffer layer 220a, a first reflective layer 230a, and a second reflective layer 232a of a semiconductor light-emitting device according to an exemplary embodiment of the present disclosure, wherein the first and second reflective layers 230a and 232a are illustrated as being separated from each other. In FIG. 15A, the first conductivity-type semiconductor lower layer 240a is illustrated as being separated into two parts, one of which includes the first reflective layer 230a.

Referring to FIG. 15A, the buffer layer 220a may be disposed on the substrate 210a, and the first reflective layer 230a may be disposed on the buffer layer 220a. Here, patterns 230Pa of the patterned first reflective layer 230a may be a pillar-shaped distributed Bragg reflector extending perpendicular to the substrate 210a. In addition, the patterns 230Pa may have a polygonal pillar shape having various cross-sectional shapes. The first conductivity-type semiconductor lower layer 240a surrounding the patterns 230Pa may be disposed between the patterns 230Pa.

The second reflective layer 232a may be disposed on the first reflective layer 230a. The second reflective layer 232a may include second openings O4a having pillar shapes extending perpendicular to the substrate 210a. A first conductivity-type semiconductor upper layer may be grown in and extend from the second openings O4a. The second openings O4a may have polygonal pillar shapes having various cross-sectional shapes. The second reflective layer 232a may be a distributed Bragg reflector. Lower surfaces of the second openings O4a may be disposed on upper surfaces of the first conductivity-type semiconductor lower layer 240a, and each second opening O4a may overlap with a respective pattern 230Pa of the first reflective layer 230a. That is, the lower surfaces of the second openings O4a may be disposed to be spaced apart from a portion of the first conductivity-type semiconductor lower layer 240a that surrounds lateral surfaces of the first reflective layer 230a.

Figure 15B:
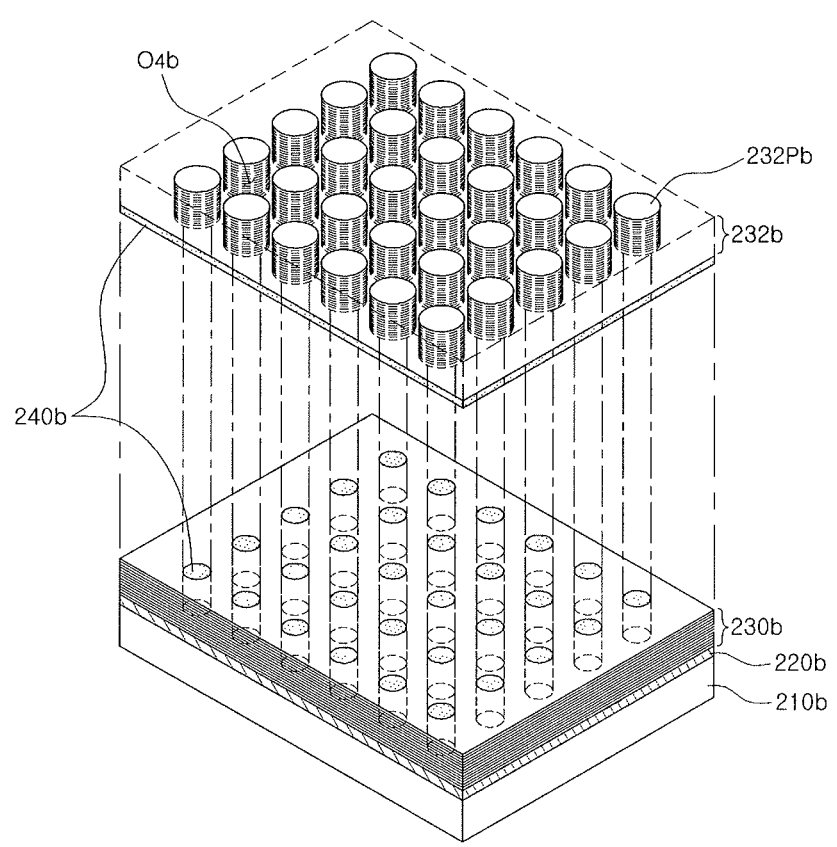
FIG. 15B is an exploded perspective view illustrating a first reflective layer and a second reflective layer of a semiconductor light-emitting device according to an exemplary embodiment of the present disclosure.

FIG. 15B is an exploded perspective view illustrating only a substrate 210b, a buffer layer 220b, a first reflective layer 230b, and a second reflective layer 232b of a semiconductor light-emitting device according to an exemplary embodiment of the present disclosure, wherein the first and second reflective layers 230b and 232b are illustrated as being separated from each other. In FIG. 15B, the first conductivity-type semiconductor lower layer 240b is illustrated as being separated into two parts, one of which includes the first reflective layer 230b.

Referring to FIG. 15B, the buffer layer 220b may be disposed on the substrate 210b, and the first reflective layer 230b may be disposed on the buffer layer 220b. The first reflective layer 230b may include first openings having a pillar shapes extending perpendicular to the substrate 210b. The first conductivity-type semiconductor lower layer 240b may be grown in and extend from the first openings. The first openings may have a polygonal pillar shapes having various cross-sectional shapes. The first reflective layer 230b may be a distributed Bragg reflector.

The second reflective layer 232b may be disposed on the first reflective layer 230b. Here, patterns 232Pb of the patterned second reflective layer 232b may be a pillar-shaped distributed Bragg reflector extending perpendicular to the substrate 210b. In addition, the patterns 232Pb may have a polygonal pillar shape having various cross-sectional shapes. Second openings O4b surrounding the patterns 232Pb may be disposed between the patterns 232Pb. A first conductivity-type semiconductor upper layer may be grown in and extend from the second openings O4b.

Lower surfaces of the second openings O4b may be disposed to be spaced apart from upper surfaces of the first openings of the first reflective layer 230b. That is, each pattern 232Pb of the second reflective layer 232Pb may overlap with a respective first opening of the first reflective layer 230b.

Figure 15C:
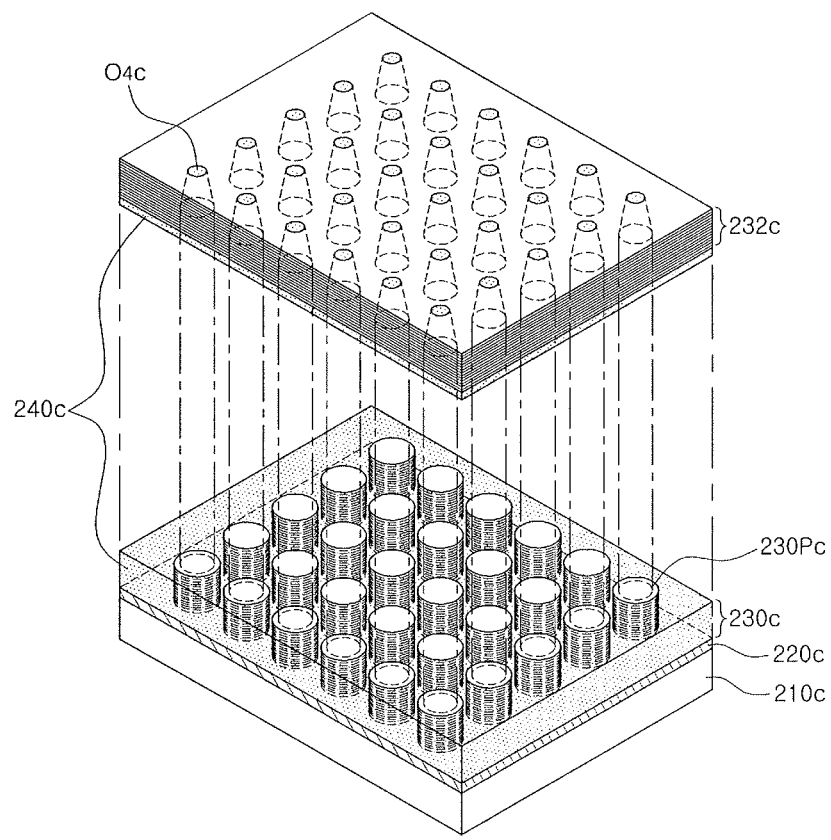
FIG. 15C is an exploded perspective view illustrating a first reflective layer and a second reflective layer of a semiconductor light-emitting device according to an exemplary embodiment of the present disclosure.

FIG. 15C is an exploded perspective view illustrating only a substrate 210c, a buffer layer 220c, a first reflective layer 230c, and a second reflective layer 232c of a semiconductor light-emitting device according to an exemplary embodiment of the present disclosure, wherein the first and second reflective layers 230c and 232c are illustrated as being separated from each other. In FIG. 15C, the first conductivity-type semiconductor lower layer 240c is illustrated as being separated into two parts, one of which includes the first reflective layer 230c.

Referring to FIG. 15C, the buffer layer 220c may be disposed on the substrate 210c, and the first reflective layer 230c may be disposed on the buffer layer 220c. Here, patterns 230Pc of the patterned second reflective layer 230c may be a pillar-shaped distributed Bragg reflector extending perpendicular to the substrate 210c. The patterns 230Pc may have a polygonal pillar shape having various cross-sectional shapes. The first conductivity-type semiconductor lower layer 240c surrounding the patterns 230Pc may be disposed between the patterns 230Pc.

The second reflective layer 232c may be disposed on the first reflective layer 230c. The second reflective layer 232c may include pillar-shaped second openings O4c having lateral surfaces angled with respect to an upper surface of the substrate 210c. Although it is illustrated that upper surfaces of the second openings O4c have a smaller cross-sectional area than lower surfaces of the second openings O4c in FIG. 15C, the lower surfaces of the second openings O4c may have a smaller cross-sectional area than the upper surfaces of the second openings O4c, on the contrary. Light emitted from a light-emitting layer may be subjected to scattered reflection on the second reflective layer 232c due to the angled lateral surfaces of the second openings O4c, and thus the light extraction efficiency may be improved. A first conductivity-type semiconductor upper layer may be grown in and extend from the second openings O4c. The second openings O4c may have a polygonal pillar shape having various cross-sectional shapes. The second reflective layer 232c may be a distributed Bragg reflector. Lower surfaces of the second openings O4c may be disposed on upper surfaces of the patterns 230Pc of the first reflective layer 230c. That is, the lower surfaces of the second openings O4c may be disposed to be spaced apart from the upper surfaces of the patterns 230Pc of the first reflective layer 230c.

Figure 15D:
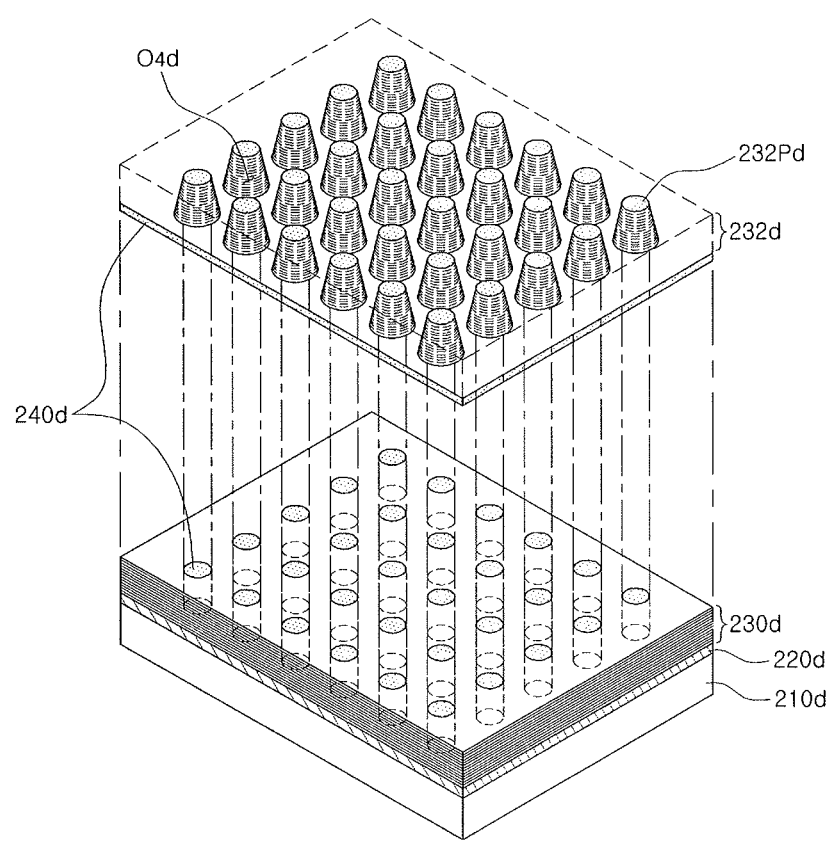
FIG. 15D is an exploded perspective view illustrating a first reflective layer and a second reflective layer of a semiconductor light-emitting device according to an exemplary embodiment of the present disclosure.

FIG. 15D is an exploded perspective view illustrating only a substrate 210d, a buffer layer 220d, a first reflective layer 230d, and a second reflective layer 232d of a semiconductor light-emitting device according to an exemplary embodiment of the present disclosure, wherein the first and second reflective layers 230d and 232d are illustrated as being separated from each other. In FIG. 15D, the first conductivity-type semiconductor lower layer 240d is illustrated as being separated into two parts, one of which includes the first reflective layer 230d.

Referring to FIG. 15D, the buffer layer 220d may be disposed on the substrate 210d, and the first reflective layer 230d may be disposed on the buffer layer 220d. The first reflective layer 230d may include first openings having a pillar shape extending perpendicular to the substrate 210d. The first conductivity-type semiconductor lower layer 240d may be grown in and extend from the first openings. The first openings may have a polygonal pillar shape having various cross-sectional shapes. The first reflective layer 230d may be a distributed Bragg reflector.

The second reflective layer 232d may be disposed on the first reflective layer 230d. Here, patterns 232Pd of the patterned second reflective layer 232d may be a pillar-shaped distributed Bragg reflector having lateral surfaces angled with respect to an upper surface of the substrate 210d. Although it is illustrated that upper surfaces of the patterns 232Pd of the second reflective layer 232d have a smaller cross-sectional area than lower surfaces of the patterns 232Pd of the second reflective layer 232d in FIG. 15D, the lower surfaces of the patterns 232Pd of the second reflective layer 232d may have a smaller cross-sectional area than the upper surfaces of the patterns 232Pd of the second reflective layer 232d, on the contrary. Light emitted from a light-emitting layer may be subjected to scattered reflection on the second reflective layer 232d due to the angled lateral surfaces of the patterns 232Pd, and thus the light extraction efficiency may be improved. In addition, the patterns 232Pd may have a polygonal pillar shape having various cross-sectional shapes. Second openings O4b surrounding the patterns 232Pd may be disposed between the patterns 232Pd. A first conductivity-type semiconductor upper layer may be grown in and extend from the second openings O4d.

Lower surfaces of the second openings O4d may be disposed to be spaced apart from upper surfaces of the first openings of the first reflective layer 230d. That is, each pattern 232Pd of the second reflective layer 232d may overlap with a respective first opening of the first reflective layer 230d.

Figure 15E:
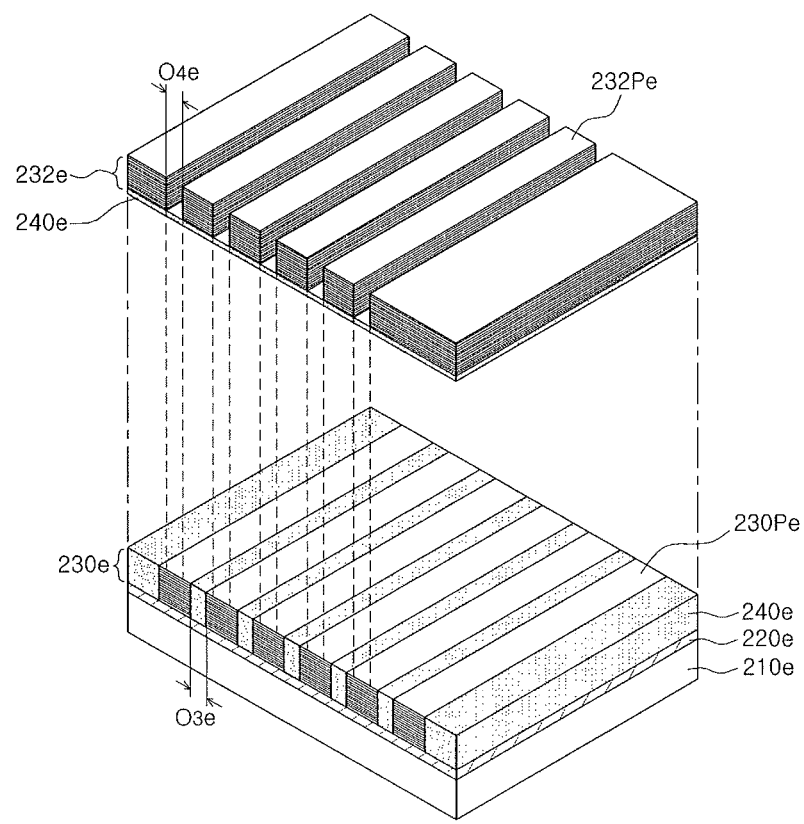
FIG. 15E is an exploded perspective view illustrating a first reflective layer and a second reflective layer of a semiconductor light-emitting device according to an exemplary embodiment of the present disclosure.

FIG. 15E is an exploded perspective view illustrating only a substrate 210e, a buffer layer 220e, a first reflective layer 230e, and a second reflective layer 232e of a semiconductor light-emitting device according to an exemplary embodiment of the present disclosure, wherein the first and second reflective layers 230e and 232e are illustrated as being separated from each other. In FIG. 15E, the first conductivity-type semiconductor lower layer 240e is illustrated as being separated into two parts, one of which includes the first reflective layer 230e.

Referring to FIG. 15E, the first reflective layer 230e may be disposed on the substrate 210e and the buffer layer 220e. The first reflective layer 230e may include trench-shaped first openings O3e extending in one direction and bar-shaped patterns 230Pe disposed alternately with the first openings O3e. The first conductivity-type semiconductor lower layer 240e grown in and extending from the first openings O3e of the first reflective layer 230e and connected on the first reflective layer 230e. The second reflective layer 232e including trench-shaped second openings O4e extending in one direction and bar-shaped patterns 232Pe disposed alternately with the second openings O4e may be formed on the first conductivity-type semiconductor lower layer 240e. In addition, lower surfaces of the second openings O4e may be disposed on the patterns 230Pe of the first reflective layer 230e.

Although not shown in the drawings, the patterns 232Pe of the second reflective layer 232e may have a bar shape having lateral surfaces angled with respect to an upper surface of the substrate 210e. Light emitted from a light-emitting layer may be subjected to scattered reflection on the second reflective layer 232e due to the angled lateral surfaces of the patterns 232Pe, and thus the light extraction efficiency may be improved.

Figure 16:
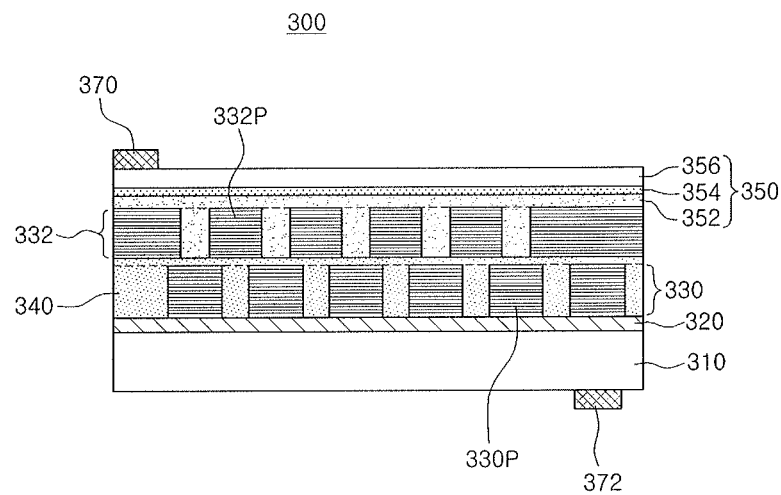
FIG. 16 illustrates a semiconductor light-emitting device according to an exemplary embodiment of the present disclosure.

FIG. 16 is a schematic cross-sectional view of a semiconductor light-emitting device according to an exemplary embodiment of the present disclosure. Hereinafter, duplicated descriptions of FIG. 1 will be omitted.

Referring to FIG. 16, a semiconductor light-emitting device 300 may include a substrate 310, a buffer layer 320 disposed on the substrate 310, a first reflective layer 330 disposed on the buffer layer 320 and including first openings and patterns 330P, a first conductivity-type semiconductor lower layer 340 grown in and extending from the first openings and connected on the first reflective layer 330, a second reflective layer 332 disposed on the first conductivity-type semiconductor lower layer 340 and including second openings and patterns 332P having lower surfaces disposed to be spaced apart from upper surfaces of the first openings, a light-emitting structure 350 including a first conductivity-type semiconductor upper layer 352 grown in and extending from the second openings and connected on the second reflective layer 332, an active layer 354, and a second conductivity-type semiconductor layer 356 sequentially disposed on the first conductivity-type semiconductor upper layer 352, a second electrode 370 disposed on the second conductivity-type semiconductor layer 356, and a first electrode 372 disposed on a lower surface of the substrate 310. Here, the substrate 310 may be formed of a conductive material, for example, a silicon substrate.

Figure 17:
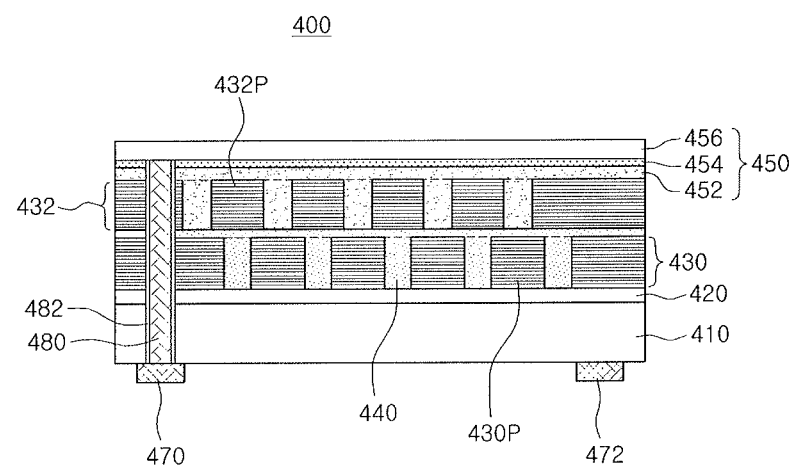
FIG. 17 illustrates a semiconductor light-emitting device according to an exemplary embodiment of the present disclosure.

FIG. 17 is a schematic cross-sectional view of a semiconductor light-emitting device according to an exemplary embodiment of the present disclosure. Hereinafter, duplicated descriptions of FIG. 1 will be omitted.

Referring to FIG. 17, a semiconductor light-emitting device 400 may include a substrate 410, a buffer layer 420 disposed on the substrate 410, a first reflective layer 430 disposed on the buffer layer 420 and including first openings and patterns 430P, a first conductivity-type semiconductor lower layer 440 grown in and extending from the first openings and connected on the first reflective layer 430, a second reflective layer 432 disposed on the first conductivity-type semiconductor lower layer 440 and including second openings and patterns 432P having lower surfaces disposed to be spaced apart from upper surfaces of the first openings, a light-emitting structure 450 including a first conductivity-type semiconductor upper layer 452 grown in and extending from the second openings and connected on the second reflective layer 432, an active layer 454, and a second conductivity-type semiconductor layer 456 sequentially disposed on the first conductivity-type semiconductor upper layer 452, a second electrode 470 disposed on a lower surface of the substrate 410 and electrically connected to the second conductivity-type semiconductor layer 456 through a through-hole 480 filled with a conductive material and surrounded by an insulating layer 482, and a first electrode 472 disposed on the lower surface of the substrate 410. Here, the substrate 410 may be formed of a conductive material, for example, a silicon substrate.

Table 1 lists computer-simulated light extraction efficiencies of Example 1, Comparative Example 1, and Comparative Example 2. Here, Example 1 is the exemplary embodiment of the present disclosure illustrated in FIG. 14, Comparative Example 1 has the same structure as Example 1 except that only one reflective layer is formed, and Comparative Example 2 has the same structure as Example 1 except that only one reflective layer is formed and the reflective layer does not include openings.

TABLE 1

|  | Example 1 | Comparative Example 1 | Comparative Example 2 |
| --- | --- | --- | --- |
| Light Extraction Efficiency (%) | 67.7 | 21.6 | 23.1 |

From the result listed in Table 1, when two reflective layers having openings positioned not to overlap each other are formed according to the embodiments of the present disclosure, light extraction efficiency may be improved by reducing dislocations propagated to a light-emitting layer and reducing light absorbed by a substrate, compared to a case in that the reflective layer does not include openings, or a case in that even if openings exist, only one reflective layer is formed.

Figure 18:
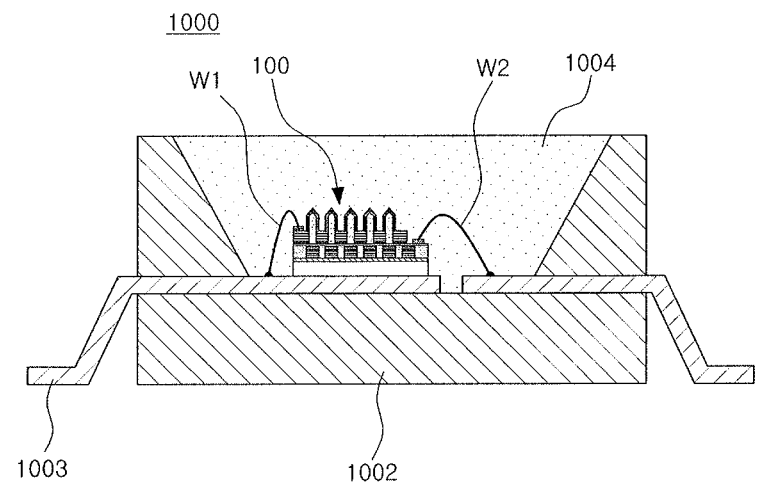
FIGS. 18 and 19 are cross-sectional views illustrating a semiconductor light-emitting device package according to an exemplary embodiment of the present disclosure.

FIG. 18 illustrates a semiconductor light-emitting device package 1000 in which the semiconductor light-emitting device 100 illustrated in FIG. 1 is mounted.

Referring to FIG. 18, the semiconductor light-emitting device 100 may be mounted on a lead frame 1003, and electrodes may be electrically connected to the lead frame 1003 by wires W1 and W2, respectively. As necessary, the semiconductor light-emitting device 100 may be mounted on an area, for example, on a package body 1002, other than the lead frame 1003. In addition, the package body 1002 may have a cup shape in order to improve light reflection efficiency, and an encapsulating structure 1004 formed of a light-transmitting material may be formed in such a reflection cup in order to encapsulate the semiconductor light-emitting device 100.

Figure 19:
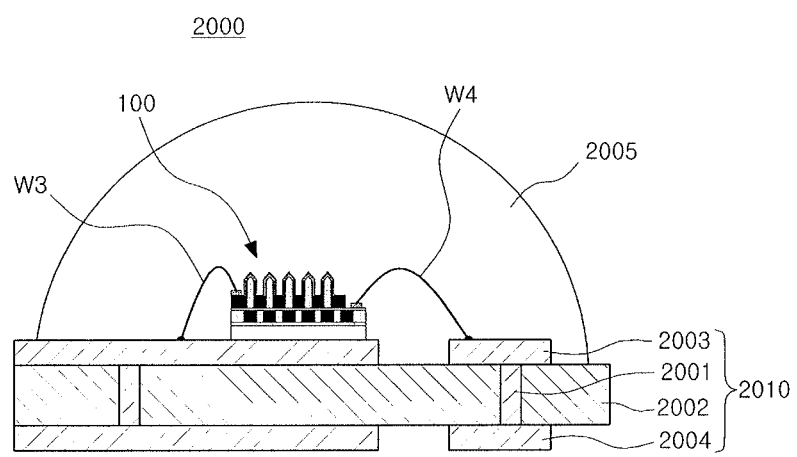

FIG. 19 illustrates a semiconductor light-emitting device package 2000 in which the semiconductor light-emitting device 100 illustrated in FIG. 1 is mounted.

Referring to FIG. 19, the semiconductor light-emitting device 100 may be mounted on a mounting board 2010 to be electrically connected to the mounting board 2010 through wires W3 and W4.

The mounting board 2010 may include a board body 2002, an upper electrode 2003, and a lower electrode 2004, and a through electrode 2001 connecting the upper electrode 2003 to the lower electrode 2004. The mounting board 2010 may be provided as a substrate, such as a PCB, an MCPCB, an MPCB, and an FPCB. The structure of the mounting board 2010 may be embodied in various forms.

An encapsulant 2005 may be formed to have a dome-shaped lens structure having a convex upper surface. In some embodiments, the encapsulant 2005 may have a convex or concave lens structure to adjust an orientation angle of light emitted through the upper surface of the encapsulant 2005. As necessary, a wavelength conversion material, such as a phosphor or a quantum dot, may be disposed on a surface of the encapsulant 2005 or the semiconductor light-emitting material.

Figure 20:
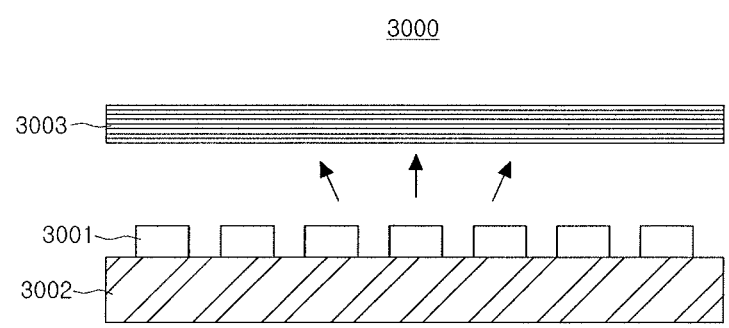
FIGS. 20 and 21 illustrate examples of a backlight unit including a nanostructure semiconductor light-emitting device according to an exemplary embodiment of the present disclosure.
Figure 21:
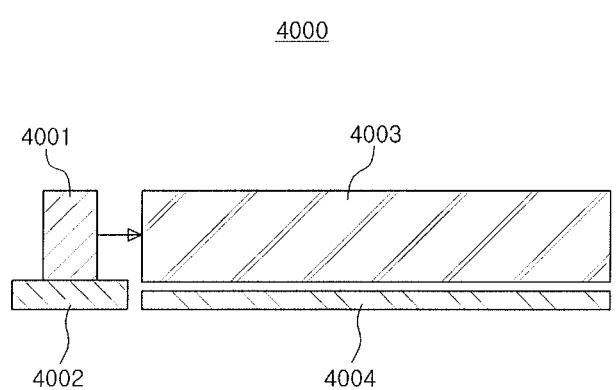

FIGS. 20 and 21 illustrate examples of a backlight unit including a semiconductor light-emitting device according to an exemplary embodiment of the present disclosure.

Referring to FIG. 20, a backlight unit 3000 may include a light source 3001 mounted on a substrate 3002, and one or more optical sheets 3003 disposed on the light source 3001. The light source 3001 may include the above-described nanostructure semiconductor light-emitting device or a package including the nanostructure semiconductor light-emitting device.

The light source 3001 in the backlight unit 3000 illustrated in FIG. 20 emits light toward a top surface where a liquid crystal display (LCD) is disposed. On the contrary, in another backlight unit 4000 illustrated in FIG. 21, a light source 4001 mounted on a substrate 4002 emits light in a lateral direction, and the emitted light may be incident to a light guide plate 4003 and converted to the form of surface light. Light passing through the light guide plate 4003 is emitted upwardly, and a reflective layer 4004 may be disposed on a bottom surface of the light guide plate 4003 to improve light extraction efficiency.

Figure 22:
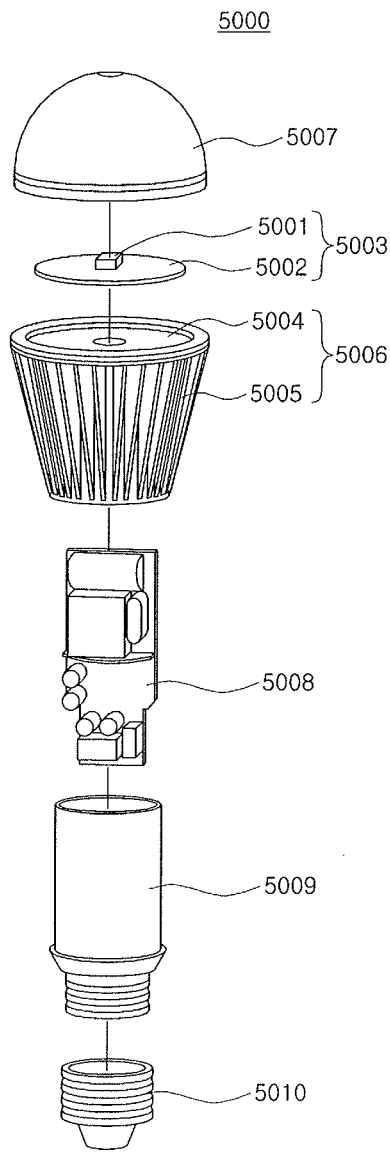
FIG. 22 illustrates an example of an illumination apparatus including a nanostructure semiconductor light-emitting device according to an exemplary embodiment of the present disclosure.

FIG. 22 is an exploded perspective view illustrating an illumination apparatus including a nanostructure semiconductor light-emitting device according to an exemplary embodiment of the present disclosure.

The illumination apparatus 5000 of FIG. 22 is illustrated as a bulb-type lamp as an example, and includes a light-emitting module 5003, a driving unit 5008, and an external connection portion 5010.

In addition, external structures, such as external and internal housings 5006 and 5009 and a cover 5007, may be further included. The light-emitting module 5003 may include a light source 5001, that is, the above-described nanostructure semiconductor light-emitting device or a package including the nanostructure semiconductor light-emitting device, and a circuit board 5002 with the light source 5001 mounted thereon. For example, first and second electrodes of the semiconductor light-emitting device may be electrically connected to an electrode pattern of the circuit board 5002. In this exemplary embodiment, a single light source 5001 is mounted on the circuit board 5002, but a plurality of light sources 5001 may be mounted as needed.

The external housing 5006 may function as a heat dissipation unit, and include a heat dissipation plate 5004 in direct contact with the light-emitting module 5003 to enhance a heat dissipation effect, and a heat radiation fin 5005 surrounding side surfaces of the illumination apparatus 5000. The cover 5007 may be installed on the light-emitting module 5003, and have a convex lens shape. The driving unit 5008 may be installed in the internal housing 5009 and connected to the external connection portion 5010, such as a socket structure, to receive power from an external power source.

In addition, the driving unit 5008 may function to convert the power into an appropriate current source capable of driving the light source 5001 of the light-emitting module 5003. For example, the driving unit 5008 may be configured as an AC-DC converter, a rectifying circuit component, or the like.

Figure 23:
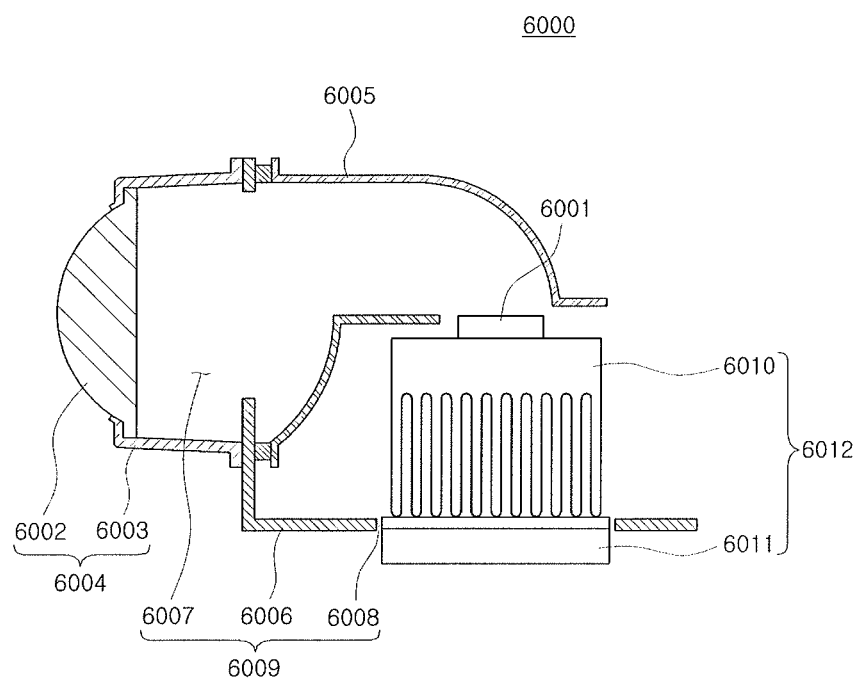
FIG. 23 illustrates an example of a headlamp including a nanostructure semiconductor light-emitting device according to an exemplary embodiment of the present disclosure.

FIG. 23 illustrates an example in which a semiconductor light-emitting device according to an exemplary embodiment of the present disclosure is applied to a headlamp.

Referring to FIG. 23, a headlamp 6000 used as a vehicle lamp, or the like, may include a light source 6001, a reflective unit 6005, and a lens cover unit 6004. The lens cover unit 6004 may include a hollow-type guide 6003 and a lens 6002. The light source 6001 may include the above-described semiconductor light-emitting device or a package including the semiconductor light-emitting device.

The headlamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. In addition, the headlamp 6000 may further include a housing 6009 fixedly supporting the heat dissipation unit 6012 and the reflective unit 6005. The housing 6009 may have a central hole 6008 formed in one surface thereof, in which the heat dissipation unit 6012 is coupledly installed.

The housing 6009 may include a front hole 6007 formed on the other surface integrally connected to the one surface and bent in a right angle direction. The front hole 6007 may fix the reflective unit 6005 to be disposed over the light source 6001. Accordingly, a front side of the housing 6009 may be open by the reflective unit 6005. The reflective unit 6005 is fixed to the housing 6009 such that the opened front side corresponds to the front hole 6007, and thereby light reflected by the reflective unit 6005 may pass through the front hole 6007 to be emitted outwardly.

As set forth above, a semiconductor light-emitting device according to the exemplary embodiments of the present disclosure have advantages of preventing dislocations from being propagated to a light-emitting layer and preventing light emitted from the light-emitting layer from being absorbed by a substrate.

While exemplary embodiments have been shown and described above, it will be apparent to those skilled in the art that modifications and variations could be made without departing from the scope of the present invention as defined by the appended claims.

What is claimed is:

1. A semiconductor light-emitting device, comprising:
 a substrate;
 a first reflective layer disposed on the substrate and including first openings;
 a first conductivity-type semiconductor lower layer grown in and extending from the first openings and connected on the first reflective layer;
 a second reflective layer disposed on the first conductivity-type semiconductor lower layer and including second openings having lower surfaces disposed to be spaced apart from upper surfaces of the first openings;
 a first conductivity-type semiconductor upper layer grown in and extending from the second openings and connected on the second reflective layer; and
 an active layer and a second conductivity-type semiconductor layer sequentially disposed on the first conductivity-type semiconductor upper layer,
 wherein:
 the second openings have a pillar shape having a lateral surface angled with respect to the upper surface of the substrate, and
 the second reflective layer includes a distributed Bragg reflector surrounding the second openings.

* * * * *